United States Patent
Huang et al.

(10) Patent No.: US 7,794,127 B2
(45) Date of Patent: Sep. 14, 2010

(54) LIGHT EMITTING DIODE HAVING GROOVES TO MODULATE LIGHT EMISSION THEREOF

(75) Inventors: Chung-Yuan Huang, Santa Clara, CA (US); Jer-Haur Kuo, Taipei Hsien (TW); Ye-Fei Yu, Shenzhen (CN); Lin Yang, Shenzhen (CN); Xin-Xiang Zha, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 205 days.

(21) Appl. No.: 12/102,868

(22) Filed: Apr. 15, 2008

(65) Prior Publication Data

US 2009/0194778 A1    Aug. 6, 2009

(30) Foreign Application Priority Data

Feb. 1, 2008    (CN)    .................... 2008 1 0066027

(51) Int. Cl.
*H01L 33/54* (2010.01)
*H01L 33/00* (2010.01)

(52) U.S. Cl. ............... 362/522; 362/296.08; 362/310; 362/311.01; 362/311.02; 362/311.06; 362/311.07; 362/311.12; 362/311.14; 362/311.15; 362/326; 362/327; 362/332; 362/335; 362/336; 362/800; 359/742; 359/743; 257/13; 257/79; 257/81; 257/84; 257/98; 257/100; 257/701; 257/787; 257/788; 257/789; 257/790; 257/791; 257/792; 257/793; 257/794; 257/795; 257/796; 257/798; 257/E33.001; 257/E33.006; 257/E33.055; 257/E33.058; 257/E33.059; 257/E33.067; 257/E23.116; 257/E23.123; 257/E23.124

(58) Field of Classification Search ............ 257/13, 257/79, 81, 84, 98, 99, 100, 701, 702, 787–796, 257/798, E33.001, E33.006, E33.055, E33.058, 257/E33.059, E33.067, E23.116, E23.123, 257/E23.124; 362/310, 311.01, 311.02, 311.06, 362/311.15, 326, 327, 332, 336, 800, 296.08, 362/311.07, 311.12, 311.14, 335, 522; 359/742, 359/743

See application file for complete search history.

(56) References Cited

U.S. PATENT DOCUMENTS

| 6,048,083 | A | 4/2000 | McDermott | |
|---|---|---|---|---|
| 6,328,456 | B1 * | 12/2001 | Mize | 362/311.02 |
| 6,679,621 | B2 * | 1/2004 | West et al. | 362/327 |
| 7,201,503 | B2 * | 4/2007 | Amano et al. | 362/522 |
| 2004/0195641 | A1 * | 10/2004 | Wirth | 257/433 |
| 2008/0247173 | A1 * | 10/2008 | Danek et al. | 362/309 |

* cited by examiner

*Primary Examiner*—Fernando L Toledo
*Assistant Examiner*—John P Dulka
(74) *Attorney, Agent, or Firm*—Frank R. Niranjan (57) ABSTRACT

A light emitting diode (10) includes an LED chip (14) and an encapsulant (16) enclosing the LED chip. The LED chip has a light emitting surface (141), and the encapsulant has a light output surface (161) over the light emitting surface. The light output surface defines a plurality of annular, concentric grooves (163). Each groove is cooperatively enclosed by a first groove wall (165) and a second groove wall (166). The first groove wall is a portion of a circumferential side surface of a cone, and a conical tip of the cone is located on the light emitting surface of the LED chip.

20 Claims, 7 Drawing Sheets

LIGHT EMITTING DIODE HAVING GROOVES TO MODULATE LIGHT EMISSION THEREOF

BACKGROUND

1. Technical Field

The present invention relates generally to light emitting diodes (LEDs), and particularly to a package structure of an LED, which can improve the radiation pattern and illumination of the light emitted from the LED.

2. Description of Related Art

With the continuing development of scientific technology, light emitting diodes (LEDs) have been widely used in the illumination field due to their high brightness, long life-span, and wide color gamut.

Presently, a conventional LED includes an LED chip, an encapsulant encapsulating the LED chip therein and two electrodes electrically connecting the LED chip to a circuit board on which the LED is mounted. The encapsulant has a smoothly dome-shaped outer surface as a light output surface. In operation of the LED, light emitted from the LED chip shoots towards the light output surface and is refracted by the light output surface, and then spreads out of the encapsulant along different directions.

In the conventional LED, the light is directly refracted by the light output surface, whose smooth nature can not help the emitted light to be concentrated to a smaller area to satisfy a pointing, indicating or spotting requirement, or can not help the emitted light to be dispersed to a larger area to satisfy a large-area illumination requirement.

What is needed, therefore, is an LED, which can overcome the above-mentioned disadvantages.

SUMMARY

The present invention relates to a light emitting diode (LED). According to a preferred embodiment of the present invention, the LED includes an LED chip and an encapsulant enclosing the LED chip. The LED chip has a light emitting surface, and the encapsulant has a light output surface over the light emitting surface. The light output surface defines a plurality of annular, concentric grooves each of which extends along a circumferential direction of the light output surface. Each groove is cooperatively enclosed by a first groove wall and a second groove wall. The first groove wall is a portion of a circumferential side surface of a cone, and a conical tip of the cone is located on the light emitting surface of the LED chip.

Other advantages and novel features of the present invention will become more apparent from the following detailed description when taken in conjunction with the accompanying drawings.

BRIEF DESCRIPTION OF THE DRAWINGS

Many aspects of the present light emitting diode (LED) can be better understood with reference to the following drawings. The components in the drawings are not necessarily drawn to scale, the emphasis instead being placed upon clearly illustrating the principles of the present LED. Moreover, in the drawings, like reference numerals designate corresponding parts throughout the several views.

DETAILED DESCRIPTION

Figure 1:
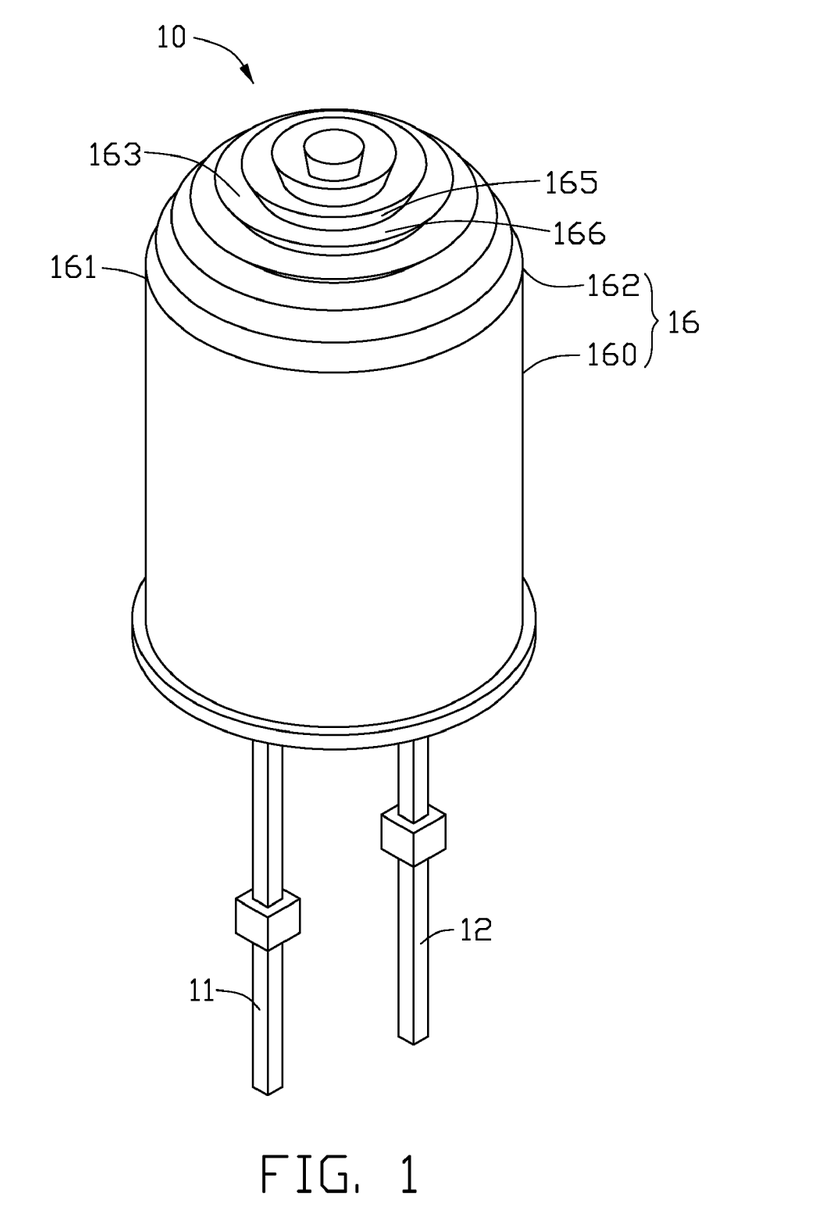
FIG. 1 is an assembled, isometric view of an LED in accordance with a first embodiment of the present invention.
Figure 2:
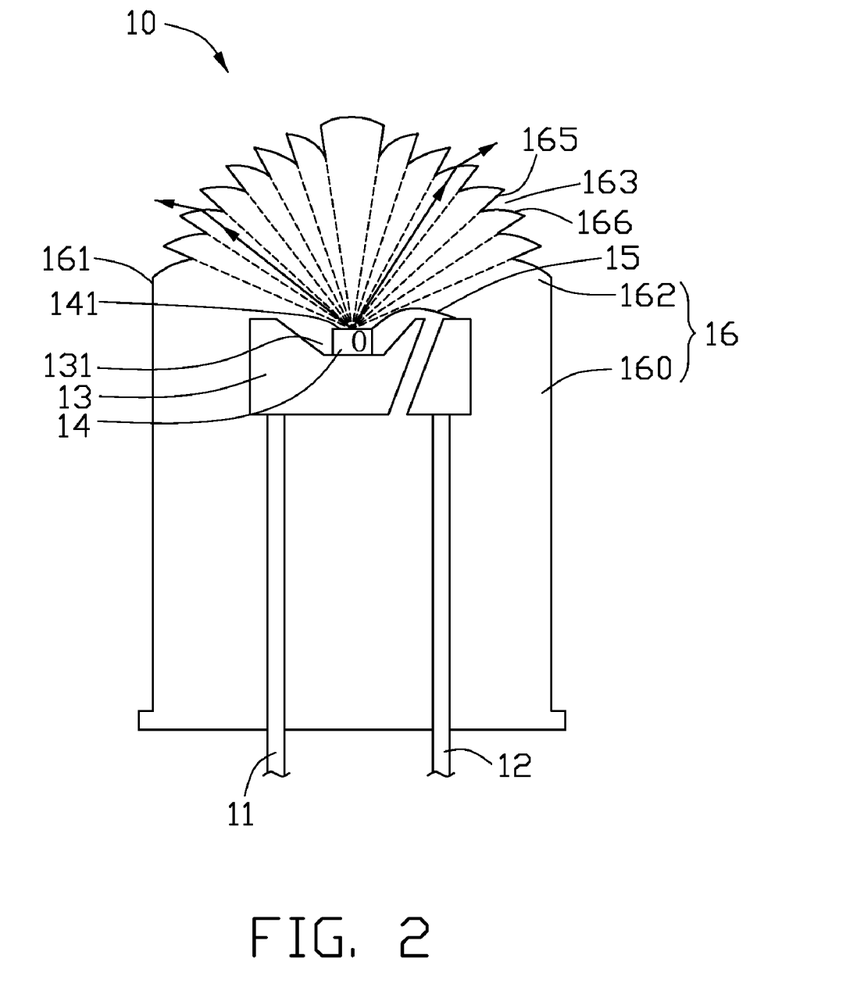
FIG. 2 is a schematic view of the LED of FIG. 1, with a part thereof being axially cut away.

Referring to FIGS. 1 and 2, a light emitting diode (LED) 10 in accordance with a first embodiment of the present invention includes a first metal electrode 11, a second metal electrode 12, a base 13, an LED chip 14, a gold wire 15 and an encapsulant 16.

The first and second metal electrodes 11, 12 are electrically connected to a circuit board (not shown) on which the LED 10 is mounted. The base 13 is engaged with a terminal of the first metal electrode 11, and defines a recess 131 in a top thereof. The LED chip 14 is received in the recess 131 and electrically connects with the first metal electrode 11 through the base 13. The LED chip 14 has a light emitting surface 141. The gold wire 15 electrically connects the LED chip 14 to the second metal electrode 12.

The encapsulant 16 is made of a transparent material, such as epoxy resin, silicone, PMMA (polymethyl methacrylate) and so on. The encapsulant 16 encloses the LED chip 14 for hermetically sealing the LED chip 14 from being corroded by the outside environment. The encapsulant 16 also provides a sufficient heat transferring path for the LED chip, which prevents the LED chip 14 from overheating during operation.

The encapsulant 16 includes a lower portion 160 and an upper portion 162. The encapsulant 16 has a light output surface 161 at the upper portion 162 thereof. The light output surface 161 is generally dome-shaped. The light output surface 161 of the encapsulant 16 defines a plurality of annular, concentric grooves 163 each of which extends along a circumferential direction thereof. Each groove 163 is cooperatively enclosed by an upper groove wall 165 and a lower groove wall 166. The upper groove wall 165 has a configuration of a straight line as viewed from FIG. 2. The upper groove wall 165 has a diameter gradually decreased along a top-to-bottom direction. In other words, the upper groove wall 165 is a portion of a circumferential side surface of an imaginary cone. A conical tip of the imaginary cone is located on the light emitting surface 141 of the LED chip 14. Specially, the conical tip of the imaginary cone is preferably located at a central point O of the light emitting surface 141 of the LED chip 14. As viewed from FIG. 2, an extension line (i.e., dotted line) of the upper groove wall 165 extends through the central point O of the light emitting surface 141 of the LED chip 14. As a result, a diameter of the upper groove wall 165 gradually reduces from a top end to a bottom end thereof. The lower groove wall 166 has a convex configuration outwardly extending from a bottom end of a corresponding upper groove wall 165, as viewed from FIG. 2. The lower groove wall 166 has a diameter gradually increased from an innermost end thereof, which locates adjacent to the upper groove wall 165 of each groove 163, towards an outermost end thereof, which locates adjacent to the upper groove wall 165 of an adjacent lower groove 163.

The grooves 163 can be achieved by one of the following techniques, such as micro injection, micro electroforming, lithography electroforming micro molding, deep X-ray lithography, laser beam machining, laser beam etching and so on.

When the present LED 10 operates, light emitted from the LED chip 14 travels in the encapsulant 16 and towards the light output surface 161. The light arrived at the light output surface 161 is refracted and passes through the lower groove walls 166, and then changes its original direction to emit outwardly, whereby the LED 10 can disperse the emitted light. Therefore, the light emitted from the LED 10 can be dispersed to a larger light receiving surface than the conventional LED. Furthermore, in the LED 10, the conical tip of the imaginary cone defined by the upper groove wall 165 is located at the central point 0 of the light emitting surface 141 of the LED chip 14. According to rectilinear propagation of light, the LED 10 can prevent the light from leaking out from the upper groove wall 165 as much as possible, thereby preventing the light from being reflected by the upper groove wall 165, thus decreasing the wastage of the light and accordingly improving illumination of the light emitting device 10.

Figure 3:
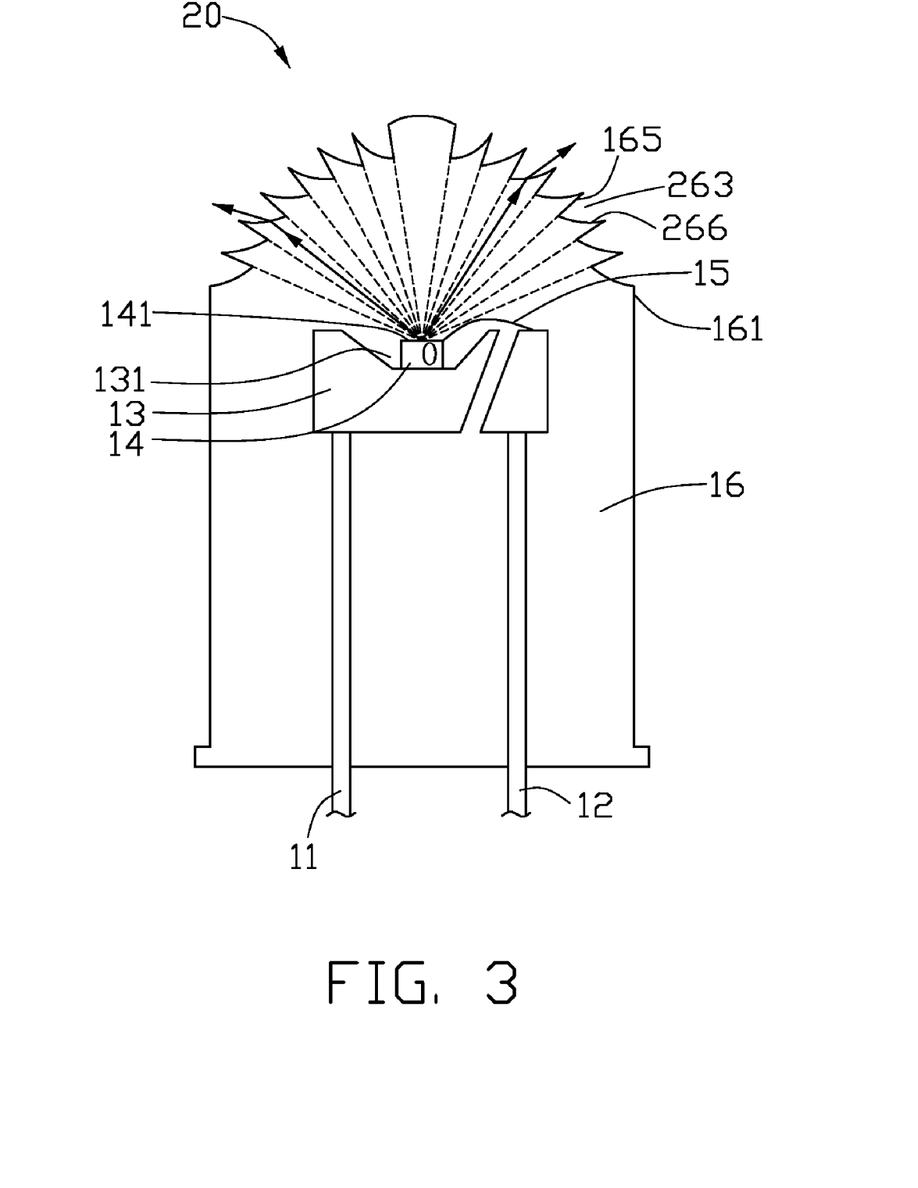
FIG. 3 is a schematic view of an LED in accordance with a second embodiment of the present invention, with a part thereof being axially cut away.

Alternatively, the lower groove wall 166 of each groove 163 in the LED 10 can be other shaped. Referring to the LED 20 shown in FIG. 3, the lower groove wall 266 of each groove 263 has a concave configuration extending outwardly from a bottom end of a corresponding upper groove wall 165. The lower groove wall 266 has a diameter gradually increased from an innermost end thereof, which locates adjacent to the upper groove wall 165 of each groove 263, towards an outermost end thereof, which locates adjacent to the upper groove wall 165 of an adjacent lower groove 263.

Figure 4:
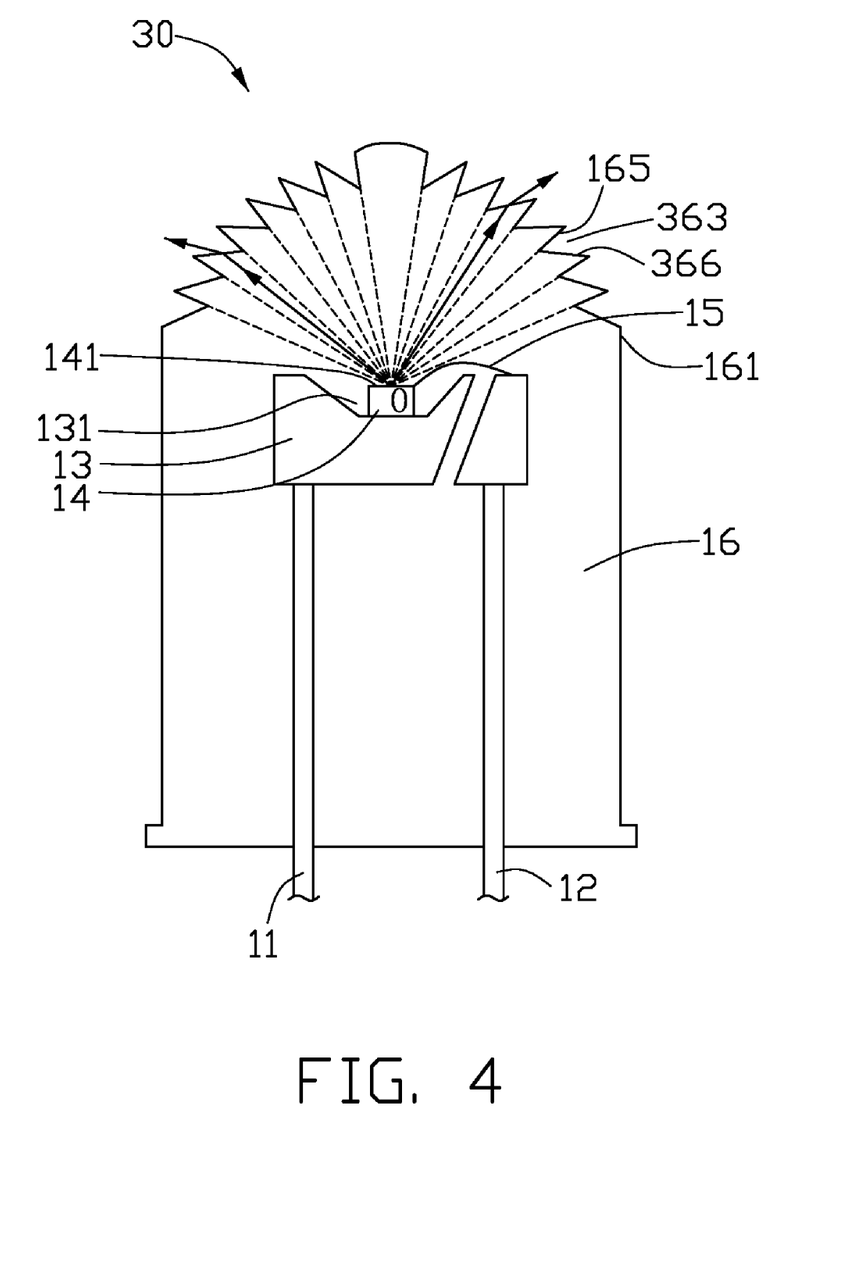
FIG. 4 is a schematic view of an LED in accordance with a third embodiment of the present invention, with a part thereof being axially cut away.

Referring to the LED 30, the lower groove wall 366 of each groove 363 has a configuration of a straight line extending outwardly from a bottom end of a corresponding upper groove wall 165, as viewed from FIG. 4. The lower groove wall 366 has a diameter gradually increased from an innermost end thereof, which locates adjacent to the upper groove wall 165 of each groove 363, towards an outermost end thereof, which locates adjacent to the upper groove wall 165 of an adjacent lower groove 363. The lower groove wall 366 is a portion of a circumferential side surface of an imaginary cone. A conical tip of the imaginary cone is not located at the central point O of the light emitting surface 141 of the LED chip 14.

Figure 5:
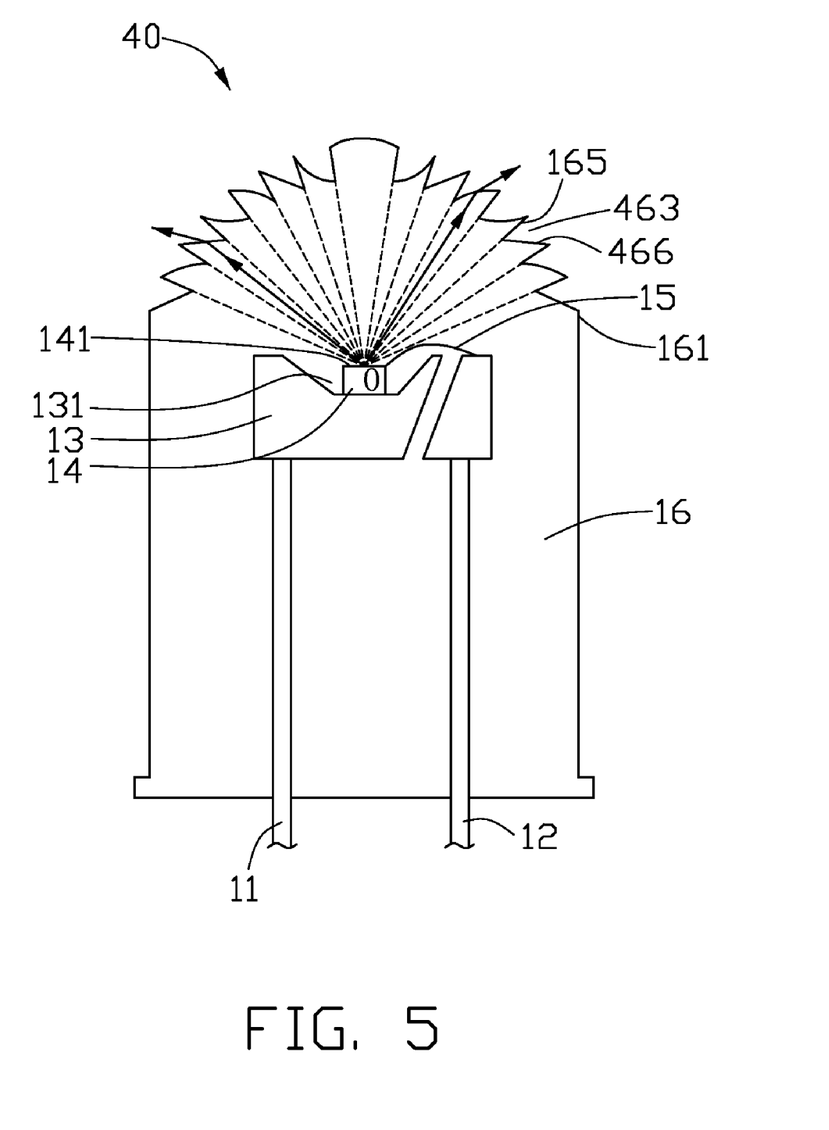
FIG. 5 is a schematic view of an LED in accordance with a fourth embodiment of the present invention, with a part thereof being axially cut away.

As shown in FIG. 5, the lower groove walls 466 of the grooves 463 of the LED 40 have three kinds of configurations in order along a radailly outward direction, i.e., concave, straight and convex.

Figure 6:
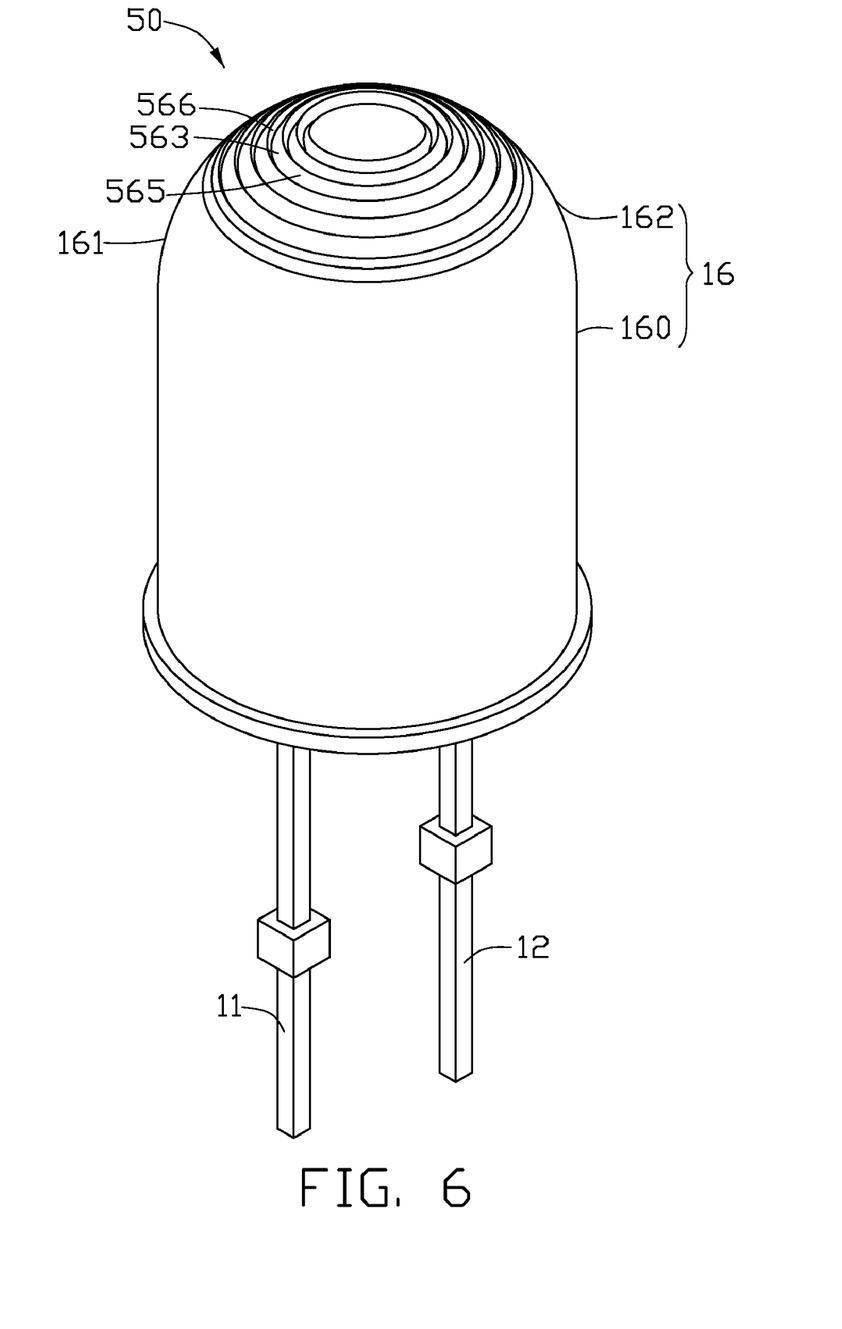
FIG. 6 is an assembled, isometric view of an LED in accordance with a fifth embodiment of the present invention.
Figure 7:
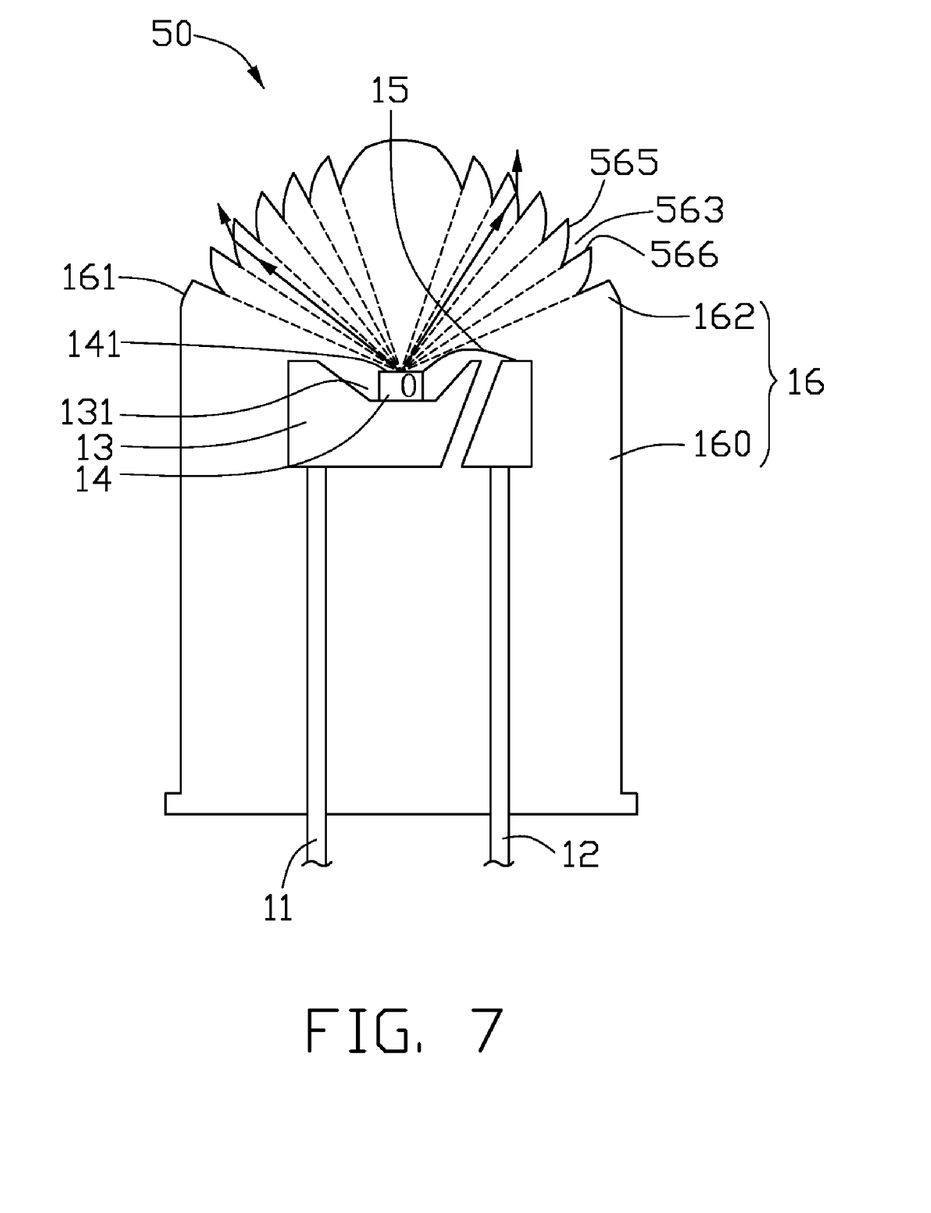
FIG. 7 is a schematic view of the LED of FIG. 6, with a part thereof being axially cut away.

Referring to FIGS. 6 and 7, an LED 50 in accordance with a fifth embodiment of the present invention is shown. In the present embodiment, the lower groove wall 566 of each groove 563 has a configuration of a straight line outwardly extending from a bottom end of the upper groove wall 565, as viewed from FIG. 7. The lower groove wall 566 is a portion of a circumferential side surface of an imaginary cone. A conical tip of the imaginary cone is located on the light emitting surface 141 of the LED chip 14. Specially, the conical tip of the imaginary cone is preferably located at a central point O of the light emitting surface 141 of the LED chip 14. As a result, a diameter defined by the lower groove wall 566 gradually reduces from a top end towards a bottom end thereof. The upper groove wall 565 of each groove 563 has a configuration of a convex flaring out from a top end of a corresponding lower groove wall 566 of an adjacent upper groove 563, as viewed from FIG. 7. Alternatively, the configuration of the upper groove wall 565 of each groove 563 can be other shaped, such as concave or straight.

When the present LED 50 operates, light emitted from the LED chip 14 travels in the encapsulant 16 and towards the light output surface 161. The light arrived at the light output surface 161 is refracted and passes through the upper groove wall 565 of each groove 563, and then changes its original direction to emit upwardly, whereby the light emitting diode 50 can be used to concentrate the emitted light. Therefore, the light emitted from the LED 50 can be concentrated to a smaller light receiving surface than the conventional LED, thus satisfying a pointing, indicating or spotting requirement. Furthermore, in the LED 50, the conical tip of the imaginary cone defined by the lower groove wall 566 is located at the central point O of the light emitting surface 141 of the LED chip 14. According to rectilinear propagation of light, the light emitting diode 50 can prevent the light from leaking out from the lower groove wall 566 as much as possible, thereby preventing the light from being reflected by the lower groove wall 566, thus decreasing the wastage of the light and accordingly improving illumination of the light.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A light emitting diode (LED) comprising:
   an LED chip comprising a light emitting surface; and
   an encapsulant enclosing of the LED chip, the encapsulant comprising a light output surface over the light emitting surface, wherein
   the light output surface defines a plurality of grooves each of which extends along a circumferential direction of the light output surface, each groove being cooperatively enclosed by a first groove wall and a second groove wall, the first groove wall being a portion of a circumferential side surface of an imaginary cone, a conical tip of the imaginary cone being located on the light emitting surface of the LED chip;
   wherein the plurality of grooves are located at a top of the LED, and the LED chip is located opposite to the grooves and closer to a bottom of the LED than the grooves; and
   wherein some ones of the second groove walls each have a diameter gradually decreasing from a bottom towards a top thereof, and other ones of the second groove walls each have a diameter gradually increasing from a bottom towards a top thereof.

2. The LED as claimed in claim 1, wherein the conical tip of the imaginary cone is located at a central point of the light emitting surface.

3. The LED as claimed in claim 1, wherein the first groove wall is an upper groove wall of each groove, and the second groove wall is a lower groove wall of each groove.

4. The LED as claimed in claim 3, wherein the light output surface disperses light emitted from the LED chip.

5. The LED as claimed in claim 1, wherein the first groove wall is a lower groove wall of each groove, and the second groove wall is an upper groove wall of each groove.

6. The LED as claimed in claim 5, wherein the light output surface concentrates light emitted from the LED chip.

7. The LED as claimed in claim 1, wherein the some ones of the second groove walls are located lower than the other ones of the second groove walls.

8. The LED as claimed in claim 1, wherein the some ones of the second groove walls are located higher than the other ones of the second groove walls.

9. An LED comprising:
   an LED chip comprising a light emitting surface; and
   an encapsulant enclosing the LED chip, wherein
   the encapsulant defines a plurality of grooves in a top thereof, each groove being cooperatively enclosed by a first groove wall and a second groove wall, the first groove wall being a portion of a circumferential side surface of an imaginary cone, a conical tip of the imaginary cone being located on the light emitting surface of the LED chip;
   wherein the plurality of grooves are located at a top of the LED, and the LED chip is located opposite to the grooves and closer to a bottom of the LED than the grooves, light generated by the LED chip and radiated from the light emitting surface thereof traveling upwardly through the grooves to an outside of the LED; and
   wherein some ones of the second groove walls each have a diameter gradually decreasing from a bottom towards a top thereof, and other ones of the second groove walls each have a diameter gradually increasing from a bottom towards a top thereof.

10. The LED as claimed in claim 9, wherein the conical tip of the imaginary cone is located at a central point of the light emitting surface.

11. The LED as claimed in claim 9, wherein the first groove wall is an upper groove wall of each groove, and the second groove wall is a lower groove wall of each groove.

12. The LED as claimed in claim 11, wherein the light output surface disperses light emitted from the LED chip.

13. The LED as claimed in claim 9, wherein the first groove wall is a lower groove wall of each groove, and the second groove wall is an upper groove wall of each groove.

14. The LED as claimed in claim 13, wherein the light output surface concentrates light emitted from the LED chip.

15. The LED as claimed in claim 9, wherein a diameter defined by the first groove wall gradually reduces from a top end towards a bottom end thereof.

16. The LED as claimed in claim 9, wherein the some ones of the second groove walls are located lower than the other ones of the second groove walls.

17. The LED as claimed in claim 9, wherein the some ones of the second groove walls are located higher than the other ones of the second groove walls.

18. An LED comprising:
    a base defining a recess in a top thereof;
    an LED chip mounted in the recess for emitting light;
    an encapsulant enclosing the base and the LED chip therein, having a dome-shaped light output surface over the LED chip;
    wherein the light output surface defines a plurality of concentric, annular grooves therein, each of the grooves being defined by at least one straight wall slantwise outwardly along a bottom-to-top direction and a sidewall, the at least one straight wall being a portion of a circumferential side surface of an imaginary cone, a conical tip of the imaginary cone being located on the LED chip;
    wherein the grooves are located at a top of the LED, and the LED chip is located opposite to the grooves and closer to a bottom of the LED than the grooves; and
    wherein some ones of the sidewalls each have a diameter gradually decreasing from a bottom towards a top thereof, and other ones of the sidewalls each have a diameter gradually increasing from a bottom towards a top thereof.

19. The LED as claimed in claim 18, wherein the grooves disperse the light emitted from the LED chip.

20. The LED as claimed in claim 18, wherein the grooves concentrate the light emitted from the LED chip.

* * * * *